US009953954B2

(12) United States Patent
Ji et al.

(10) Patent No.: US 9,953,954 B2
(45) Date of Patent: Apr. 24, 2018

(54) WAFER-LEVEL CHIP-SCALE PACKAGE WITH REDISTRIBUTION LAYER

(71) Applicant: MediaTek Inc., Hsin-Chu (TW)

(72) Inventors: Yan-Liang Ji, Hsinchu (TW); Ming-Jen Hsiung, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/274,506

(22) Filed: Sep. 23, 2016

(65) Prior Publication Data

US 2017/0162540 A1 Jun. 8, 2017

Related U.S. Application Data

(60) Provisional application No. 62/262,420, filed on Dec. 3, 2015.

(51) Int. Cl.
*H01L 23/52* (2006.01)
*H01L 23/00* (2006.01)

(52) U.S. Cl.
CPC ............. *H01L 24/94* (2013.01); *H01L 24/02* (2013.01); *H01L 24/05* (2013.01); *H01L 24/13* (2013.01); *H01L 2224/0214* (2013.01); *H01L 2224/0236* (2013.01); *H01L 2224/02145* (2013.01); *H01L 2224/02166* (2013.01); *H01L 2224/02181* (2013.01); *H01L 2224/02371* (2013.01); *H01L 2224/02381* (2013.01); *H01L 2224/0401* (2013.01); *H01L 2224/05082* (2013.01); *H01L 2224/05094* (2013.01); *H01L 2224/05096* (2013.01); *H01L 2224/12105* (2013.01);

(Continued)

(58) Field of Classification Search
CPC ......... H01L 24/13; H01L 24/05; H01L 24/03; H01L 24/02; H01L 24/94
USPC .......................................................... 257/737
See application file for complete search history.

(56) References Cited

U.S. PATENT DOCUMENTS 6,921,714 B2 * 7/2005 Yamaha ................... H01L 24/03
257/E23.02
7,364,998 B2 * 4/2008 Chiu ........................ H01L 24/03
257/737

(Continued)

FOREIGN PATENT DOCUMENTS

TW 200729366 A 8/2007
TW 201304098 A 1/2013
WO WO 2014/174825 A1 10/2014

*Primary Examiner* — Luan C Thai
(74) *Attorney, Agent, or Firm* — McClure, Qualey & Rodack, LLP (57) ABSTRACT

A Wafer-level chip scale package (WLCSP) includes a semiconductor structure and a first bonding pad formed over a portion of the semiconductor structure. The WLCSP further includes a passivation layer formed over the semiconductor structure and the first bonding pad, exposing portions of the first bonding pad. The WLCSP further includes a conductive redistribution layer formed over the passivation layer and the portions of the first bonding pad exposed by the passivation layer. The WLCSP further includes a planarization layer formed over the passivation layer and the conductive redistribution layer, exposing a portion of the conductive redistribution layer. The WLCSP further includes an under-bump-metallurgy (UBM) layer formed over the planarization layer and a conductive bump formed over the UBM layer.

25 Claims, 10 Drawing Sheets

(52) U.S. Cl.
CPC ............... *H01L 2224/13024* (2013.01); *H01L 2224/13027* (2013.01)

(56) References Cited

U.S. PATENT DOCUMENTS

| | | | | |
|---|---|---|---|---|
| 7,701,063 | B2* | 4/2010 | Kanzaki | H01L 24/03 257/758 |
| 7,952,206 | B2* | 5/2011 | Bachman | H01L 24/03 257/737 |
| 7,977,789 | B2* | 7/2011 | Park | H01L 24/03 257/737 |
| 8,076,780 | B2* | 12/2011 | Saigoh | H01L 23/3157 257/760 |
| 8,319,343 | B2* | 11/2012 | Archer, III | H01L 24/11 257/760 |
| 2002/0117756 | A1 | 8/2002 | Yamashita | |
| 2005/0064624 | A1 | 3/2005 | Murakami | |
| 2008/0012129 | A1 | 1/2008 | Watanabe | |
| 2015/0228594 | A1 | 8/2015 | Alvarado et al. | |
| 2015/0279776 | A1 | 10/2015 | Hu et al. | |
| 2016/0086960 | A1* | 3/2016 | Wen | H01L 27/11507 257/295 |

* cited by examiner

WAFER-LEVEL CHIP-SCALE PACKAGE WITH REDISTRIBUTION LAYER

CROSS REFERENCE TO RELATED APPLICATIONS

This application claims the benefit of U.S. Provisional Application No. 62/262,420 filed Dec. 3, 2015, the entirety of which is incorporated by reference herein.

BACKGROUND OF THE INVENTION

Field of the Invention

The present invention relates to integrated circuits (ICs), and in particular to a wafer-level chip scale package (WLCSP) with a redistribution layer and a method of manufacturing the same.

Description of the Related Art

The desire to make electronic products small, lightweight, and high-performing has developed into a desire to make electronic parts small, lightweight, and high-performing. This desire has caused developments to proceed in various packaging technologies, along with developments in the technologies related to designing and manufacturing semiconductors. Representative examples of packaging technologies include the ball grid array (BGA), the flip-chip, and the chip scale package (CSP) based on area array and surface-mount packaging.

Among the above, the CSP is a packaging technology that enables a small package to be the same size as the real chip to be developed. In particular, in a Wafer-level chip scale package (WLCSP), the packaging is performed in a wafer level so that the packaging costs per chip can be remarkably reduced. Typically, the WLCSP includes a redistribution layer (RDL) wiring traces, an under bump metallurgy (UBM) layer forming a bump, and a passivation layer protecting a circuit.

BRIEF SUMMARY OF THE INVENTION

An exemplary Wafer-level chip scale package (WLCSP) comprises a semiconductor structure and a first bonding pad formed over a portion of the semiconductor structure. The WLCSP further comprises a passivation layer formed over the semiconductor structure and the first bonding pad, wherein the passivation layer exposes a plurality of portions of the first bonding pad. The WLCSP further comprises a conductive redistribution layer formed over the passivation layer and the portions of the first bonding pad exposed by the passivation layer. The WLCSP further comprises a planarization layer formed over the passivation layer and the conductive redistribution layer, exposing a portion of the conductive redistribution layer. The WLCSP further comprises an under-bump-metallurgy (UBM) layer formed over the planarization layer and the portion of the conductive redistribution layer exposed by the planarization layer. The WLCSP further comprises a conductive bump formed over the UBM layer.

An exemplary method for forming a Wafer-level chip scale package (WLCSP) comprises providing a semiconductor structure having a first bonding pad formed over the semiconductor structure and forming a passivation layer over the semiconductor structure and the first bonding pad, wherein the passivation layer exposes a plurality of portions of the first bonding pad. The method further comprises forming a conductive redistribution layer over the passivation layer and the portions of the first bonding pad exposed by the passivation layer, and forming a planarization layer over the passivation layer and the conductive redistribution layer, exposing a portion of the conductive redistribution layer. The method further comprises forming an under-bump-metallurgy (UBM) layer over the portion of the portion of the conductive redistribution layer exposed by the planarization layer, and forming a conductive bump formed over the UBM layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
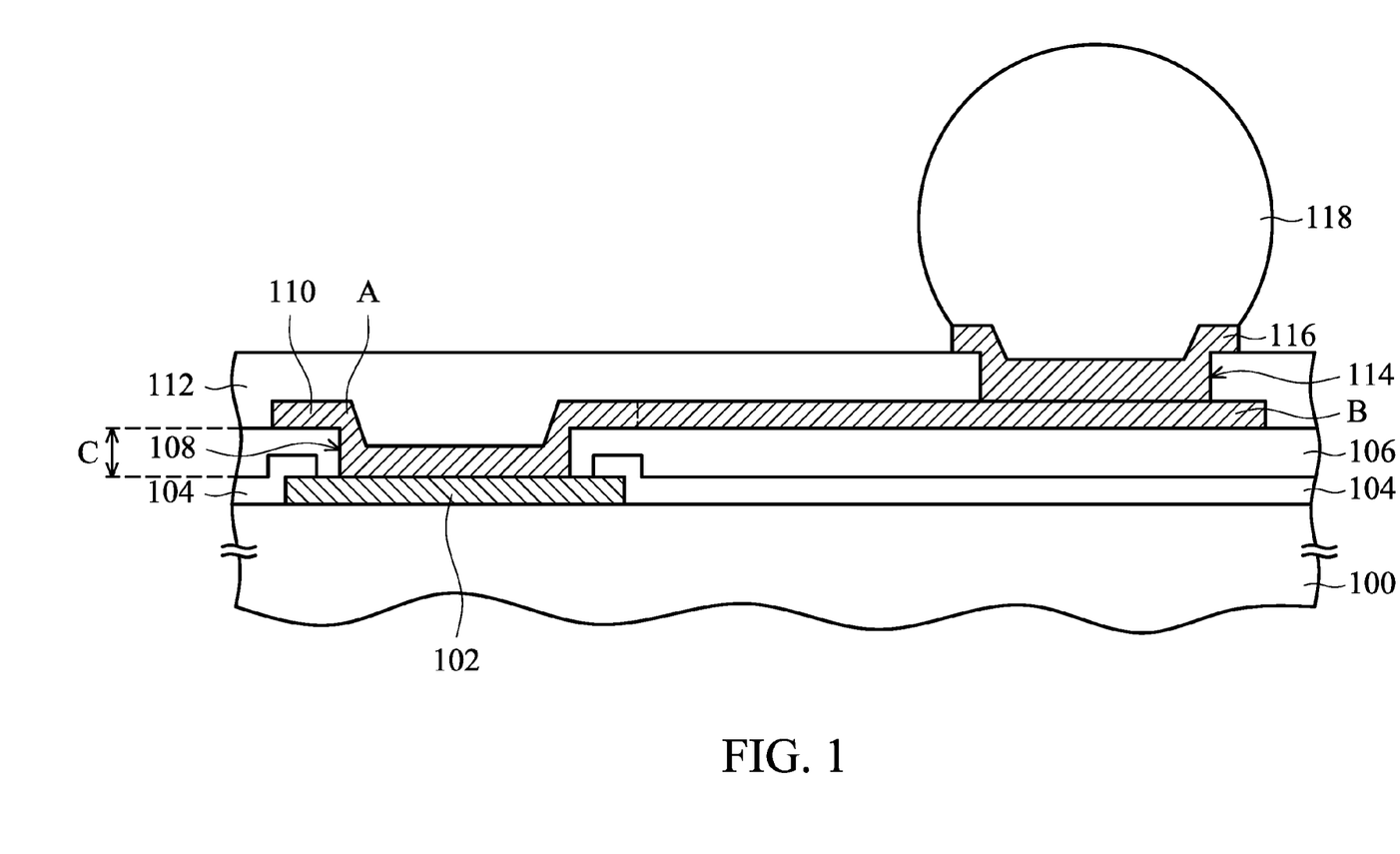
FIG. 1 is a schematic cross section showing a Wafer-level chip scale package (WLCSP) according to an embodiment of the present disclosure.

FIG. 1 is a schematic cross section showing a Wafer-level chip scale package (WLCSP) according to an embodiment of the present disclosure.

As shown in FIG. 1, the WLCSP comprises a semiconductor structure 100, a bonding pad 102, a passivation layer 104, a first planarization layer 106, a second planarization layer 112, a conductive redistribution layer 110, an under-bump-metallurgy (UBM) layer 116, and a conductive bump 118.

Herein, the semiconductor structure 100 is illustrated as a structure having a flat top surface for the purpose of simplifying the figure. It should be noted that the semiconductor structure 100 can be a wafer-level semiconductor substrate having a plurality of semiconductor devices and interconnect structures (both not shown) formed thereon. The semiconductor devices formed over the semiconductor structure 100 can be, for example, active devices such as transistors or diodes and/or passive devices such as capacitors, resistors and conductors. The interconnect structures in the semiconductor structure 100 may comprise a multi-layer metallization structure isolated and supported by a plurality of interlayer dielectric layers. In this embodiment, only a portion of the semiconductor structure 100 is illustrated as the WLCSP.

Referring to FIG. 1, the bonding pad 102 is formed over a portion of the semiconductor structure 100 and may be electrically connected with one of the interconnect structure (not shown) of a circuit formed in the semiconductor structure 100. The passivation layer 104 and the first planarization layer 106 are sequentially formed over the semiconductor structure 100, and the passivation layer 104 and the first planarization layer 106 partially respectively cover portions of the bonding pad 102. An opening 108 is formed in the first planarization layer 106 to expose a portion of the bonding pad 102, and the conductive redistribution layer 110 is conformably formed over portions of the first planarization layer 106 and in the opening to cover the portion of the bonding pad 102 exposed by the opening 108. The second planarization layer 112 is formed over the first planarization layer 106 and the conductive redistribution layer 110, and an opening 116 is formed in the second planarization layer 112 to expose a portion of the conductive redistribution layer 110. The UBM layer 116 is formed over a portion of the second planarization layer 112 and the portion of the conductive redistribution layer 110 exposed by the second planarization layer 112, and the conductive bump 118 is formed over the UBM layer 116.

In this embodiment, the bonding pad 102 may comprise conductive materials such as aluminum, and the passivation layer 104 may comprise dielectric materials such as silicon oxide, silicon nitride, or combination thereof. The first planarization layer 106 and the second planarization layer 108 may comprise dielectric materials such as silicon nitride, silicon oxide, or polymer. In one embodiment, the polymer suitable for the first planarization layer 106 and the second planarization layer 108 can be, for example, polyimide, polybenzoxazole, or benzocyclobutene. The conductive redistribution layer 110 may comprise conductive materials such as copper, nickel, or aluminum. The UBM layer 116 may comprise conductive materials such as metals or metal alloys such as Ni layers, Ag layers, Al layers, Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. Typically, the first passivation layer 106 is provided with a thickness C of about 51 µm to about 7.5 µm a step-height of the first planarization layer over the bonding pad 102 is too large, such that opening 108 formed in the first planarization layer 106 is a single opening of a greater dimension of, for example, about 22 µm to about 30 µm. Therefore, the conductive redistribution layer 110 is conformably formed over portions of the first planarization layer 106 and the portion of the bonding pad 102 exposed by the opening 108 and has a step portion A of a step-like configuration near the opening 108 and a flat portion B of a flat configuration extending from the opening 114 and over the first planarization layer 106. In addition, the opening 114 formed in the second planarization layer 112 exposes a portion of the planar portion B of the conductive redistribution layer 110, such that the UBM layer 116 can be conformably disposed over portions of the second planarization layer 112 and the planar portion B of the conductive redistribution layer 110 exposed by the opening 114.

In the WLCSP shown in FIG. 1, since the first planarization layer 106 is provided, and it has a thickness C of about 5 µm to about 7.5 µm, the step-height of the first planarization layer 106 near the opening 108 is too large to make the opening 108 smaller. Thus, the portion of the conductive redistribution layer 110 near the opening 108 is formed with a step-like configuration, and the UBM layer 116 and the solder bump 118 formed over the UBM layer only can be formed over the planar portion B of the conductive redistribution layer 110 extending from the opening 108 and over the first passivation layer 106. Therefore, the footprint of the WLCSP shown in FIG. 1 is quite large, which is undesirable because of the trend towards further reduction in the size of the integrated circuits in the WLCSP.

Therefore, FIGS. 2-8 are schematic cross sections showing a method for forming a Wafer-level chip scale package (WLCSP) having a structure with a reduced size, according to another embodiment of the present disclosure.

Figure 2:
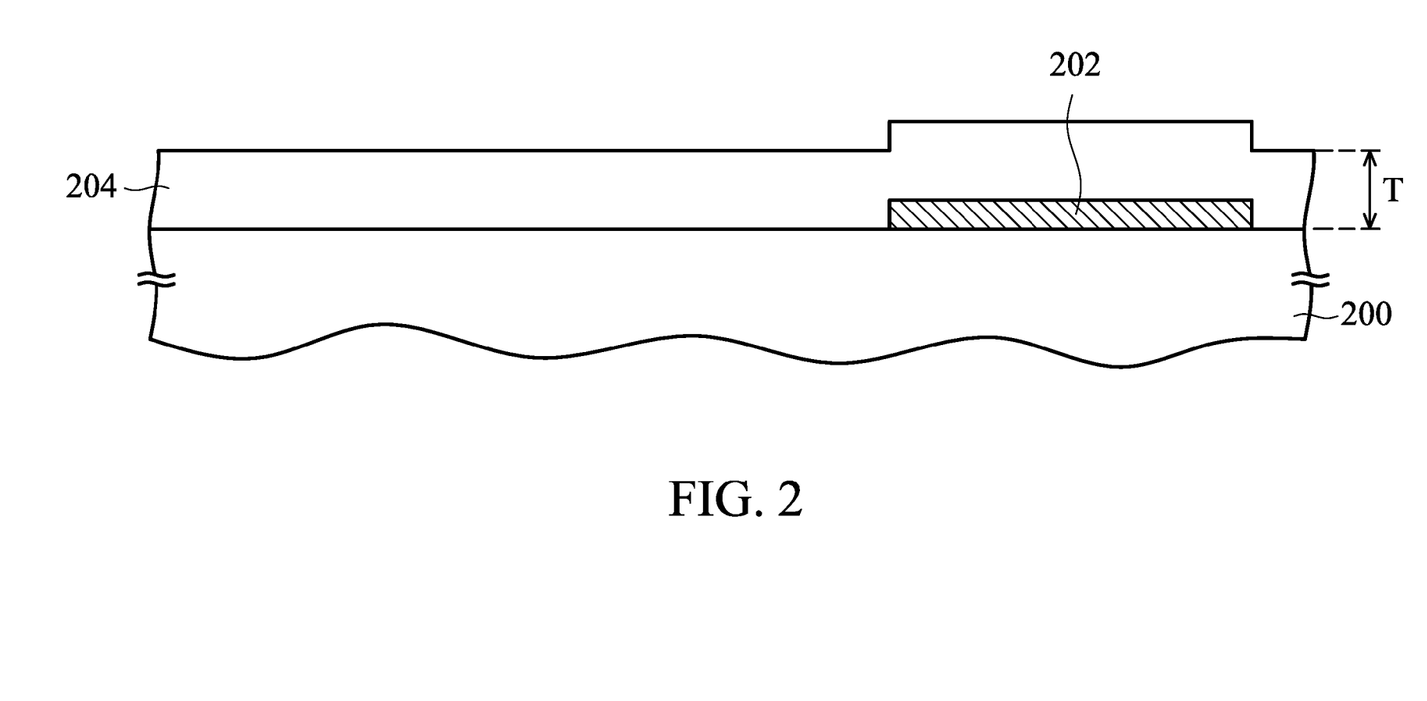
FIGS. 2-8 are a schematic cross sections showing a method for forming a Wafer-level chip scale package (WLCSP) according to an embodiment of the present disclosure.

Referring to FIG. 2, a semiconductor structure 200 having a bonding pad 202 formed over a portion of the semiconductor structure 200 is provided. Next, a passivation layer 204 is conformably formed over the semiconductor structure 200 and the first bonding pad 204 by, for example, a chemical vapor deposition (CVD) process (not shown). Since the passivation layer 204 is conformably formed over the semiconductor structure 200 and the first bonding pad 202, the passivation layer 204 has a non-flat top surface over the semiconductor structure 200. In one embodiment, the portion of the passivation layer 204 formed over the semiconductor structure 200 has a thickness T of about 1 µm to about 6 µm.

In one embodiment, the semiconductor structure 200 is the same as the semiconductor structure 100 shown in FIG. 1, and the passivation layer 204 and the bonding pad 202 are respectively the same as those used for forming the passivation layer 104 and the bonding pad 102 shown in FIG. 1.

Figure 3:
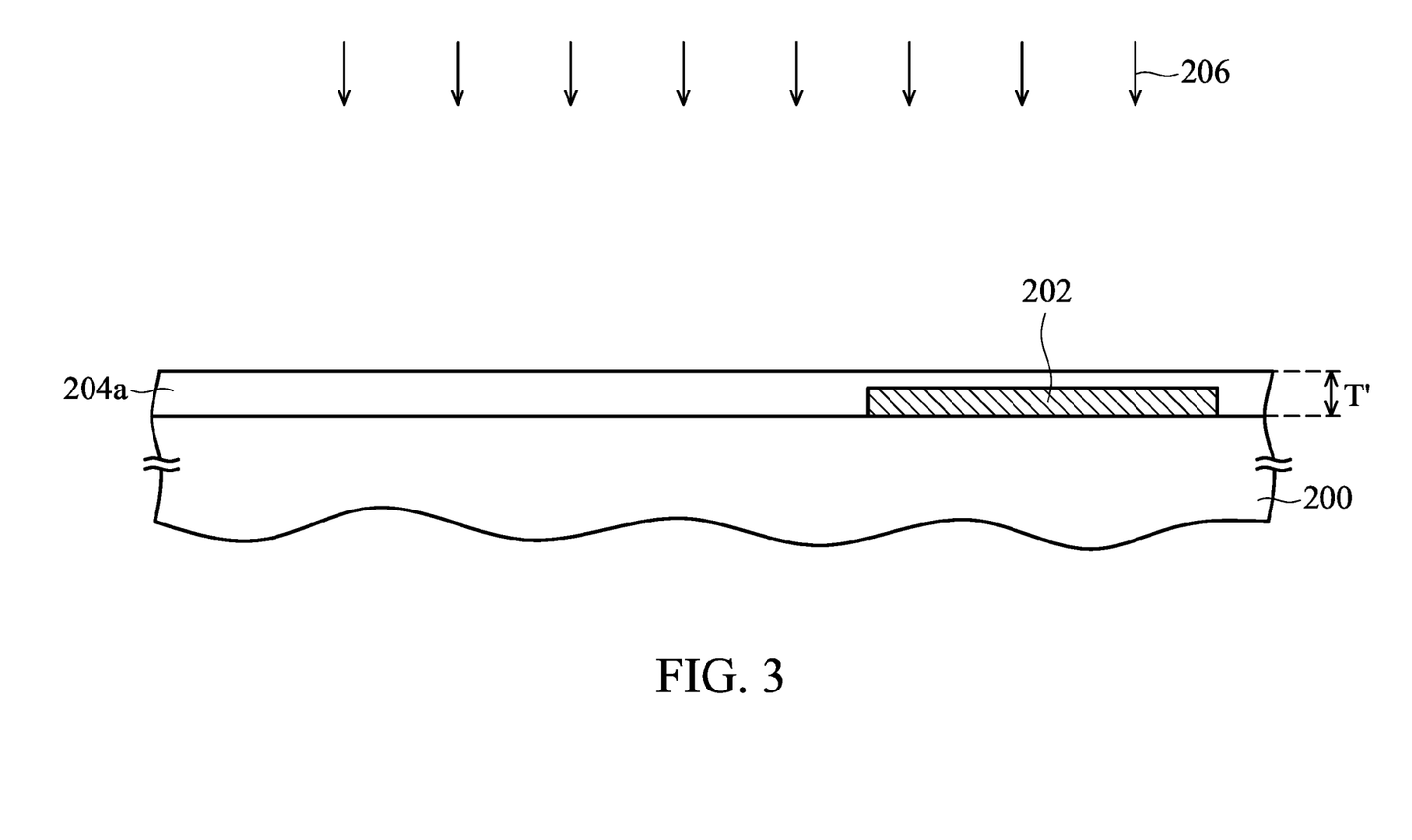

Referring to FIG. 3, a planarization process 206 is performed to level a top surface of the passivation layer 204 and reduce the thickness of the passivation layer 204, thereby leaving a passivation layer 204a having a flat top surface over both the semiconductor structure 200 and the bonding pad 202. At this time, the passivation layer 204a has a reduced thickness T' of about 1 µm to about 6 µm above the semiconductor structure 200. The planarization process 206 can be a chemical mechanical polishing (CMP) process, for example, or an etching back process.

Figure 4:
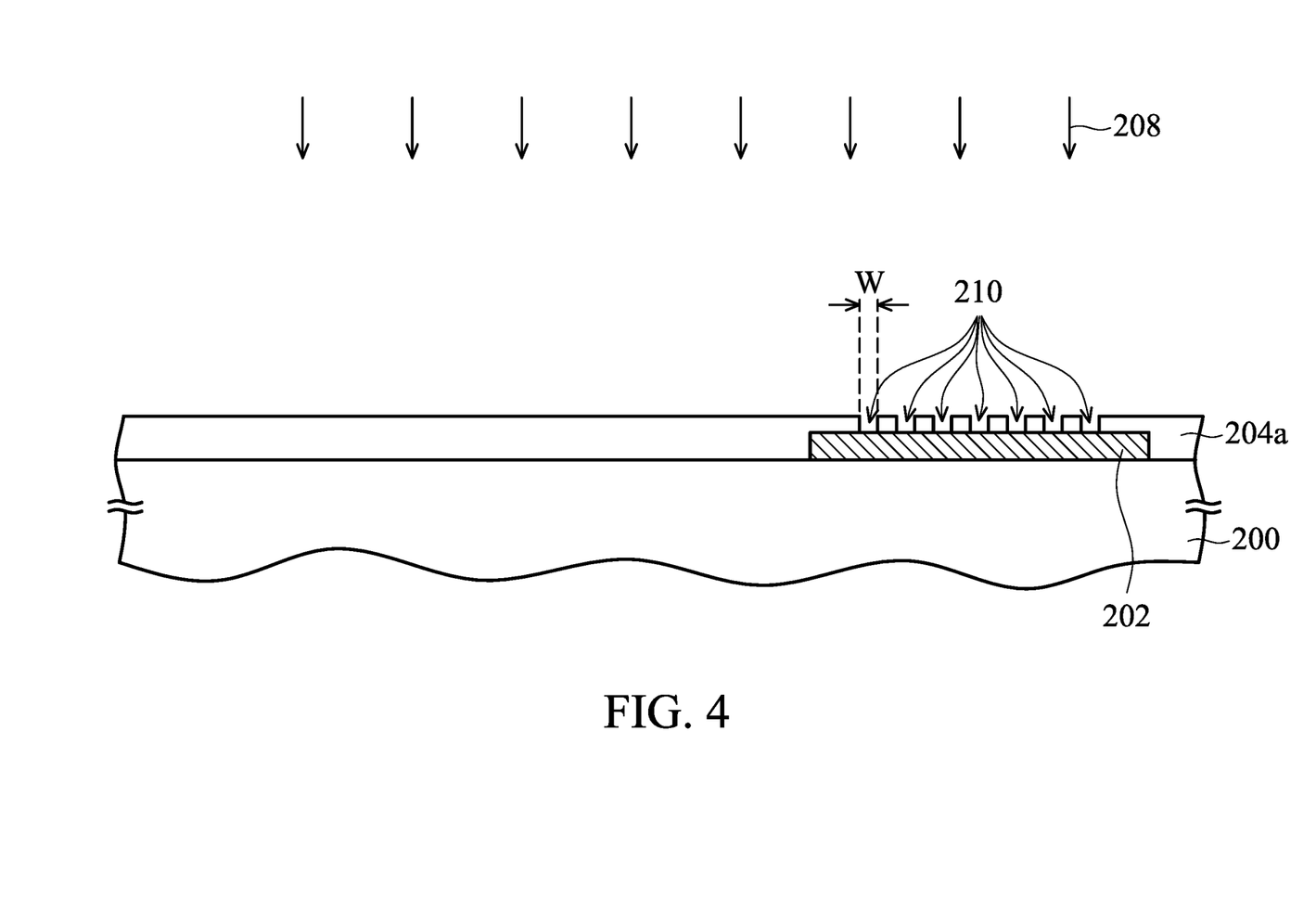

Referring to FIG. 4, a patterning process 208 is next performed on the passivation layer 204a shown in FIG. 3 to form a plurality of openings 210 only in portions of the passivation layer 204a over the bonding pad 202. Therefore, a plurality of portions of the bonding pad 202 is exposed by the openings 210. Each of the openings 210 has a dimension W, for example a width, of about 2 µm or above, and the openings 210 may have a circular, stripe-like, or polygonal shape from a top view (not shown). In one embodiment, the patterning process 208 may comprise photolithography and etching steps (not shown) with suitable patterned masks (not shown) used as an etching mask.

Figure 5:
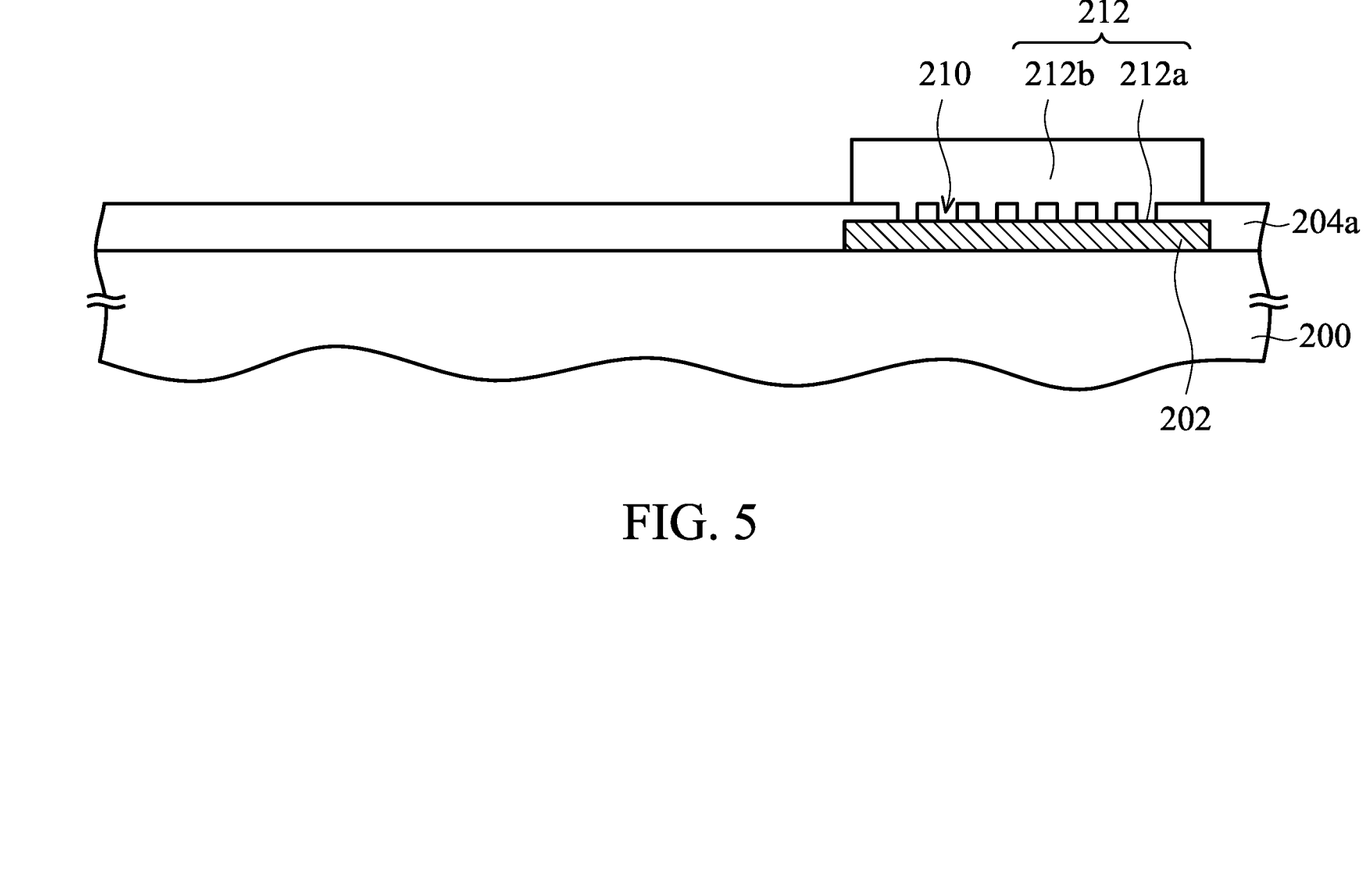

Referring to FIG. 5, a patterned conductive redistribution layer 212 is next formed over portions of the passivation layer 204a over the bonding pad 202. As shown in FIG. 5, the patterned conductive redistribution layer 212 comprises a plurality of first portions 212a filling the openings 210 formed in the passivation layer 204a, and a second portion 212b formed above the flat top surface of the passivation layer 204a and the openings 210. Therefore, the patterned conductive redistribution layer 212 is also provided with a substantially flat top surface, as shown in FIG. 5. The patterned conductive redistribution layer 212 can be formed by first forming a conductive redistribution layer 212 over the passivation layer 204a and in the openings 210, and then the conductive redistribution layer 212 is patterned by a patterning process (not shown) comprising photolithography and etching steps (not shown) incorporating suitable patterned masks (not shown) as an etching mask. Conductive materials for forming the patterned conductive redistribution layer 212 can be the same as those of the conductive redistribution layer 110 shown in FIG. 1, with a thickness of about 4 µm to about 9 µm above the passivation layer 204a.

Figure 6:
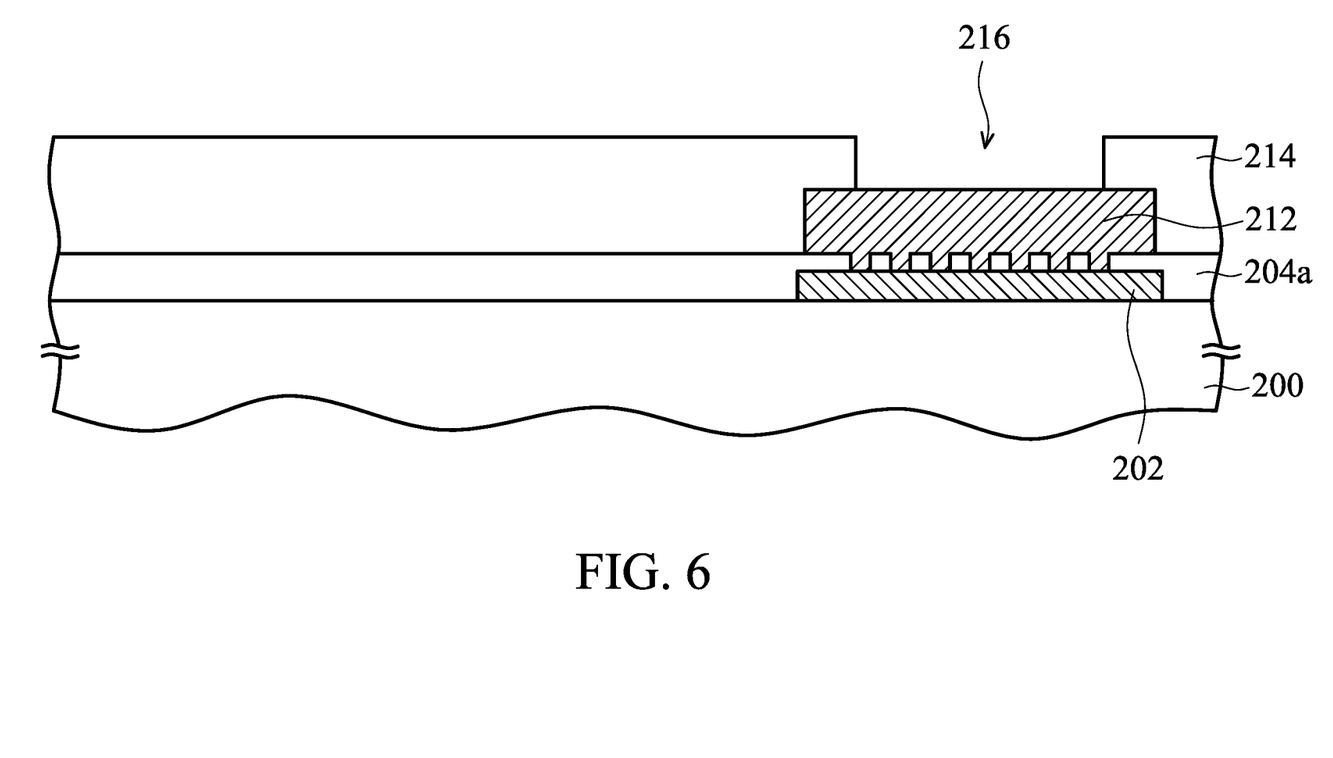

Referring to FIG. 6, a planarization layer 214 is formed over the top surface of the structure shown in FIG. 5, and an opening 216 is then formed in a portion of the planarization layer 214 to expose a portion of the patterned conductive redistribution layer 212. The planarization layer 214 can be formed by a chemical vapor deposition (CVD) or spin coating process, for example, and may be patterned by a patterning process (not shown) comprising photolithography and etching steps (not shown) incorporating suitable patterned masks (not shown) as an etching mask. Materials for forming the planarization layer 214 can be the same as those of the first planarization layer 112 shown in FIG. 1, and the planarization layer 214 may have a thickness of about 7.5 µm to about 10 µm which is greater than the thickness of the patterned conductive redistribution layer 212.

Figure 7:
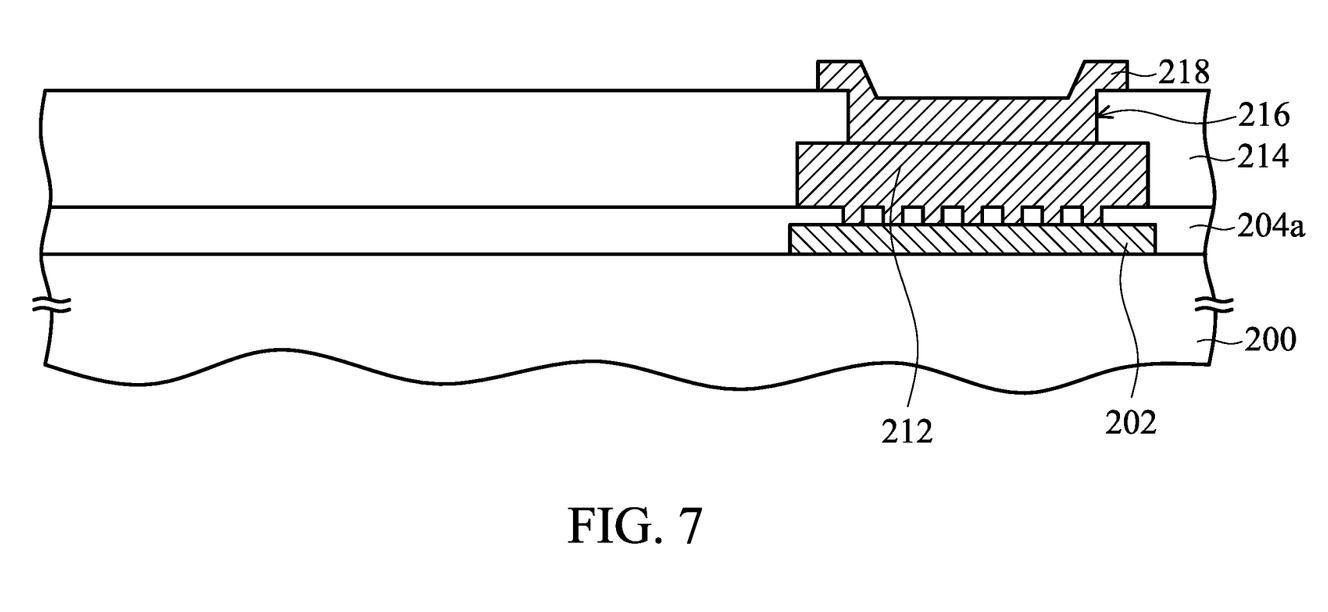

Referring to FIG. 7, an under-bump-metallurgy (UBM) layer 218 is next formed over the portion of the patterned conductive redistribution layer 212 exposed by the opening 216 and portions of the planarization layer 214 adjacent to the opening 216. The UBM layer 218 can be formed by forming a layer of conductive material over the structure shown in FIG. 6 by, for example, a chemical vapor deposition (CVD) or electrical plating process, and is then patterned by a patterning process (not shown) comprising photolithography and etching steps (not shown) incorporating suitable patterned masks (not shown) as an etching mask. Materials for forming the UBM layer 218 can be the same as that of the UBM layer 116 shown in FIG. 1, and the UBM layer 218 may have a thickness of about 4 µm to about 9 µm.

Figure 8:
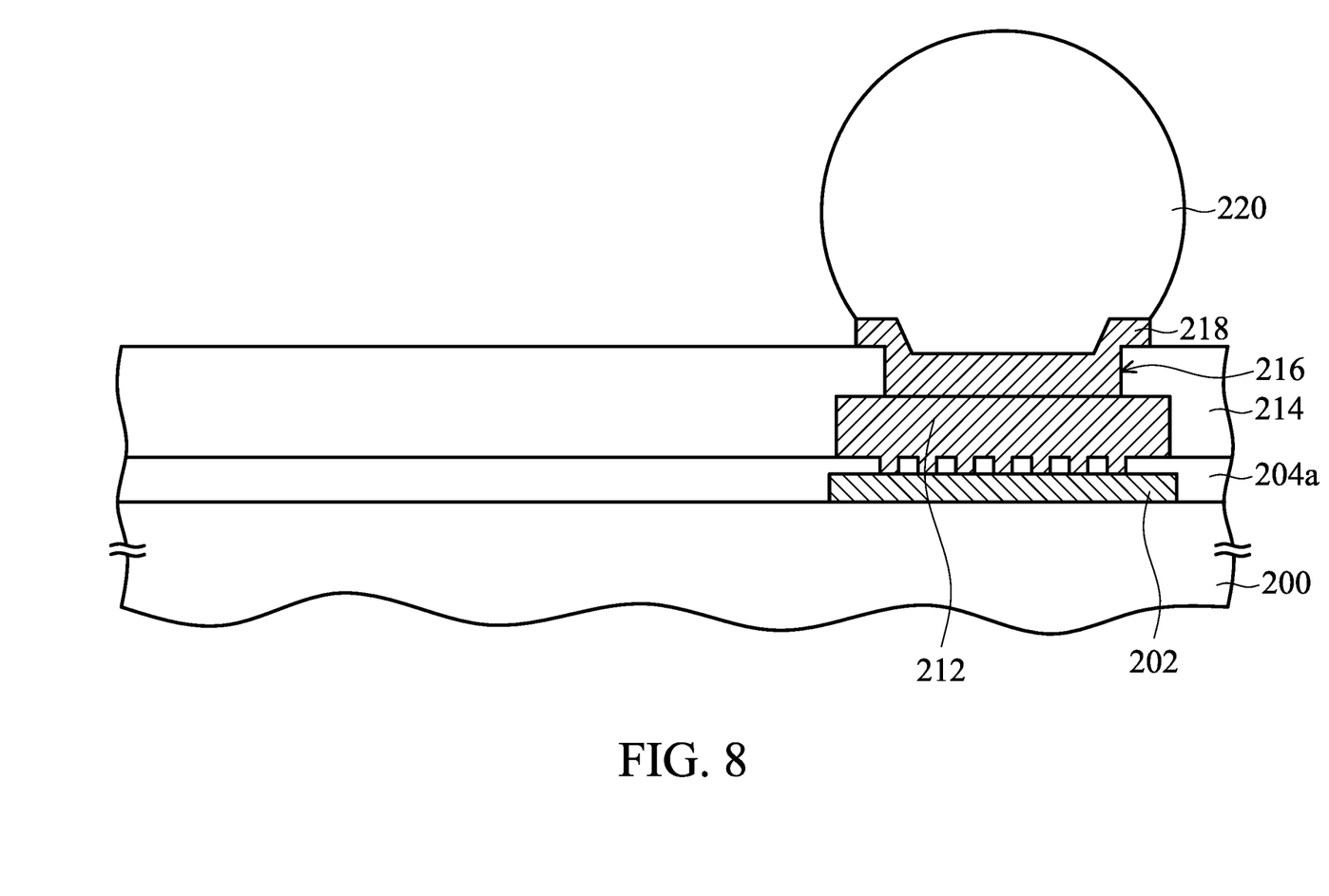

Referring to FIG. 8, a conductive bump 220 is next formed over the UBM layer 218 by conventional solder bump formation processes. Since the patterned conductive redistribution layer 212 is now provided with a substantially flat top surface rather than a step-like configuration, the UBM layer 218 and the conductive bump 220 can be sequentially and firmly formed over the patterned conductive redistribution layer 212. In addition, since the patterned conductive redistribution layer 212 is formed directly over the bonding pad 202, the conductive bump 220 and the UBM layer 218 are also formed directly over the bond pad 202, so that a bonding structure for the WLCSP with a reduced size can be obtained.

In addition, since there is only one planarization layer 214 utilized in the WLCSP shown in FIG. 8, the WLCSP in FIG. 8 can be fabricated more easily than the WLCSP shown in FIG. 1, which utilizes two planarization layers.

Figure 9:
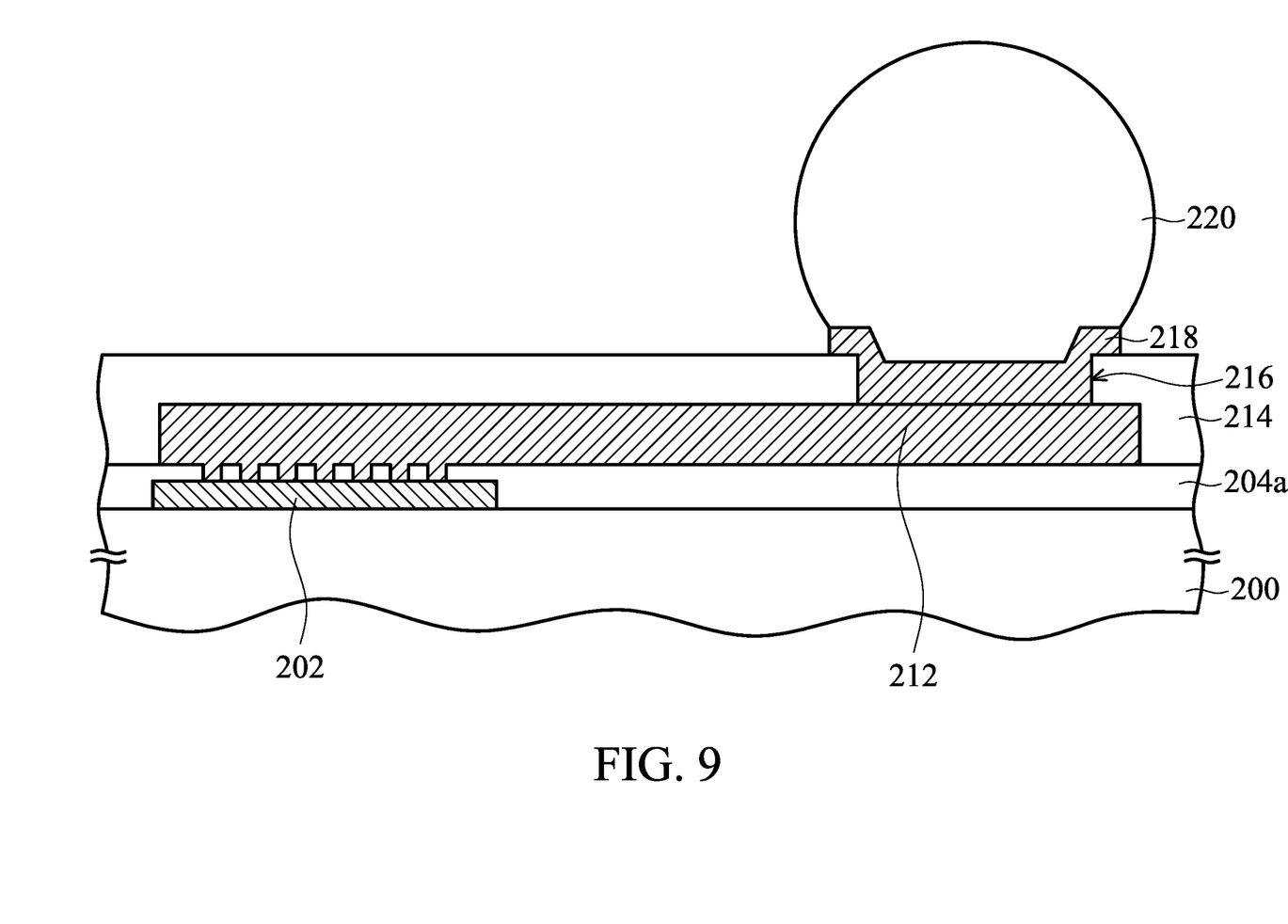
FIG. 9 is a schematic cross section showing a Wafer-level chip scale package (WLCSP) according to another embodiment of the present disclosure.

In addition to the exemplary embodiment shown in FIG. 8, FIG. 9 is a schematic cross section showing another exemplary Wafer-level chip scale package (WLCSP) of the present disclosure. At this time, the WLCSP shown in FIG. 9 is modified from the WLCSP shown in FIG. 8, and similar components in FIG. 9 are represented with the same reference numbers shown in FIG. 8, and only differences between the WLCSPs shown in FIGS. 8-9 are discussed as below.

Referring to FIG. 9, the second portion 212b of the patterned conductive redistribution layer 212 having a flat top surface is not only formed over the bonding pad 202 as shown in FIG. 8, but it further extends over a portion of the passivation layer 204a not covering the bonding pad 202 to thereby provide a line-routing function, so that the UBM layer 218 and the conductive bump 220 can thus be formed over a portion of the second portion 212b of the patterned conductive redistribution layer 212 at a place that is not covering the bonding pad 202. Similarly, since there is only one planarization layer 214 utilized in the WLCSP shown in FIG. 9, the WLCSP in FIG. 9 can also be fabricated more easily than the WLCSP shown in FIG. 1, which utilizes two planarization layers.

Figure 10:
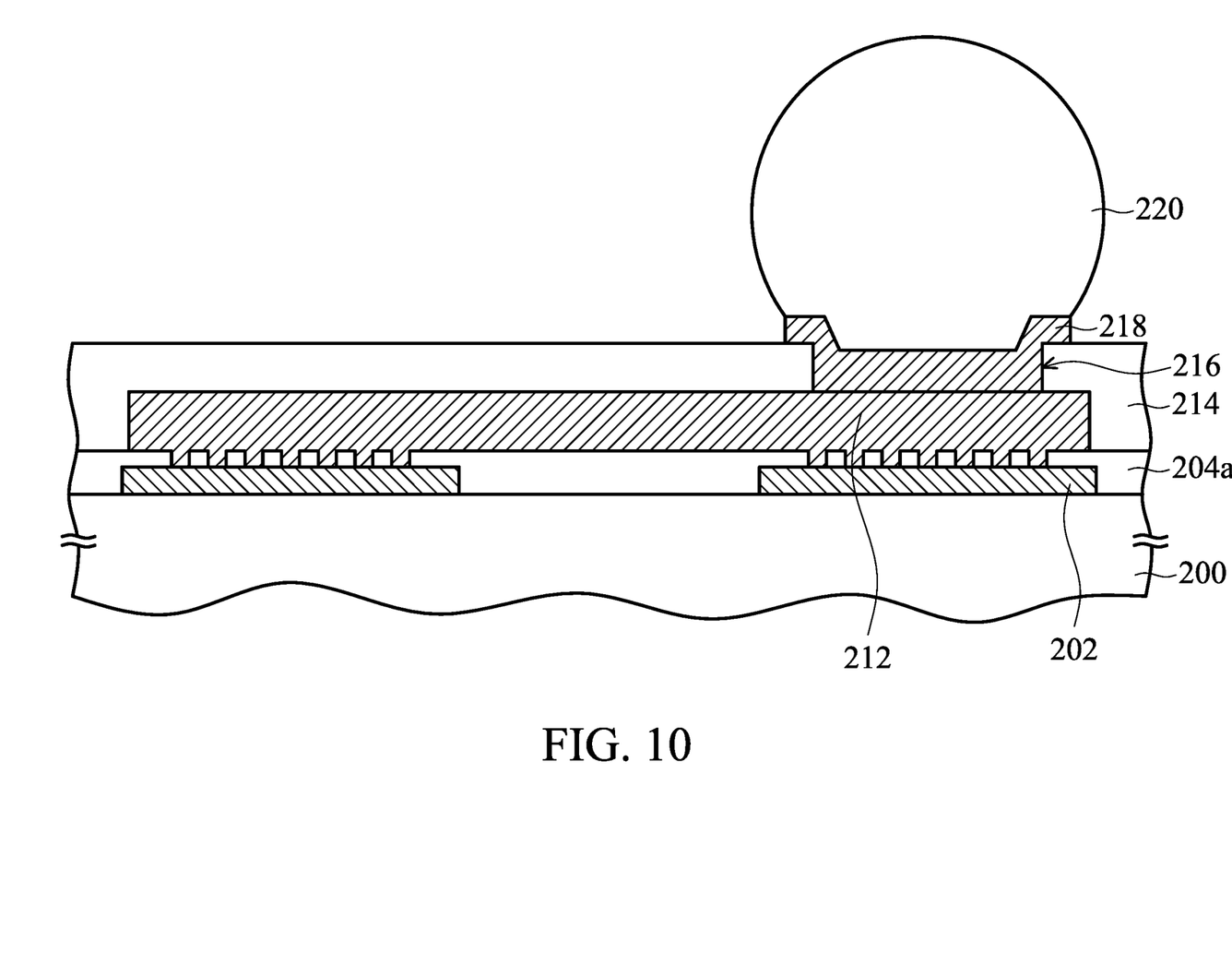
FIG. 10 is a schematic cross section showing a Wafer-level chip scale package (WLCSP) according to yet another embodiment of the present disclosure.

In addition to the exemplary embodiment shown in FIG. 9, FIG. 10 is a schematic cross section showing another exemplary Wafer-level chip scale package (WLCSP) of the present disclosure. At this time, the WLCSP shown in FIG. 10 is modified from the WLCSP shown in FIG. 9, and similar components shown in FIG. 10 are represented with the same reference numbers, and only differences between the WLCSPs shown in FIGS. 9-10 are discussed as below.

Referring to FIG. 10, the semiconductor structure 200 is now provided with two isolated bonding pads 202 formed thereover, and configurations of the passivation layer 204a and the openings 210 formed in the passivation layer 204a are the same at a place over each of the bonding pads 202. In this embodiment, the patterned conductive redistribution layer 212 has a first portion 212a formed in the openings 210 which are formed over each of the passivation layers 204a over the bonding pads 202 and a second portion 212b over the leveled passivation layer 204a between the bonding pads 202. The UBM layer 218 and the conductive bump 220 are formed over a portion of the second portion 212b of the conductive redistribution layer 212 over one of the bonding pads 202.

Similarly, the patterned conductive redistribution layer 212 is now provided with a substantially flat top surface, so the UBM layer 218 and the conductive bump 220 can thus be formed firmly over the patterned conductive redistribution layer 212. In addition, since the patterned conductive redistribution layer 212 is formed directly over the bonding pad 202, the conductive bump 220 and the UBM layer 218 are also formed directly over one of the bond pads 202, so that a bonding structure for the WLCSP with a reduced size can be obtained.

Moreover, since there is only one planarization layer 214 utilized in the WLCSP shown in FIG. 10, the WLCSP in FIG. 9 can be fabricated more easily than the WLCSP shown in FIG. 1, which utilizes two planarization layers.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer-level chip-scale package, comprising:
   a semiconductor structure;
   a first bonding pad formed over a portion of the semiconductor structure;
   a second bonding pad formed over another portion of the semiconductor structure;
   a passivation layer formed over the semiconductor structure, the first bonding pad and the second bonding pad, wherein the passivation layer exposes a plurality of discontinuous portions of the first bonding pad and a plurality of discontinuous portions of the second bonding pad, and the passivation layer is a single layer in direct contact with sidewalls of the first bonding pad;
   a conductive redistribution layer formed over and in direct contact with the passivation layer, the portions of the first bonding pad and the portions of the second boding pad exposed by the passivation layer;

a planarization layer formed over the passivation layer and the conductive redistribution layer, exposing a portion of the conductive redistribution layer;

an under-bump-metallurgy (UBM) layer formed over the planarization layer and the portion of the conductive redistribution layer exposed by the planarization layer; and a conductive bump formed over the UBM layer.

2. The Wafer-level chip-scale package claimed in claim 1, wherein the passivation layer formed over the semiconductor structure and the first bonding pad has a flat top surface.

3. The Wafer-level chip-scale package claimed in claim 1, wherein the conductive redistribution layer formed over the portions of the first bonding pad exposed by the passivation layer has a substantially flat top surface.

4. The Wafer-level chip-scale package claimed in claim 1, wherein the passivation comprises dielectric materials.

5. The Wafer-level chip-scale package claimed in claim 1, wherein the planarization layer comprises polyimide, polybenzoxazole or benzocyclobutene.

6. The Wafer-level chip-scale package claimed in claim 1, wherein the UBM layer is formed over a portion of the conductive redistribution layer at a place over the portions of the first bonding pad exposed by the passivation layer.

7. The Wafer-level chip-scale package claimed in claim 1, wherein the UBM layer is formed over the portion of the conductive redistribution layer at a place that is not over the portions of the first bonding pad exposed by the passivation layer.

8. The Wafer-level chip-scale package claimed in claim 1, wherein the portions of the first bonding pad exposed by the passivation layer respectively have a dimension of about 2 µm or above from a top view.

9. The Wafer-level chip-scale package claimed in claim 1, wherein the portions of the first bonding pad exposed by the passivation layer respectively have a circular, stripe-like, or polygonal shape.

10. The Wafer-level chip-scale package claimed in claim 1, further comprising a second bonding pad formed over another portion of the semiconductor structure.

11. The Wafer-level chip-scale package claimed in claim 10, wherein the passivation layer is formed over the second bonding pad and exposes a plurality of portions of the second bonding pad.

12. The Wafer-level chip-scale package claimed in claim 11, wherein the conductive redistribution layer is formed over the portions of the second bonding pad exposed by the passivation layer and has a substantially flat top surface.

13. The Wafer-level chip-scale package claimed in claim 12, wherein the UBM layer is formed over a portion of the conductive redistribution layer at a place over the portions of the first bonding pad exposed by the passivation layer or portions of the second bonding pad exposed by the passivation layer.

14. A method for forming a wafer-level chip-scale package, comprising:

providing a semiconductor structure having a first bonding pad formed over a portion of the semiconductor structure and a second bonding pad over another portion of the semiconductor structure;

forming a passivation layer over the semiconductor structure and the first bonding pad, wherein the passivation layer exposes a plurality of discontinuous portions of the first bonding pad and a plurality of discontinuous portions of the second bonding pad, and the passivation layer is a single layer in direct contact with sidewalls of the first bonding pad;

forming a conductive redistribution layer over and in direct contact with the passivation layer, the portions of the first bonding pad and the portions of the second boding pad exposed by the passivation layer;

forming a planarization layer over the passivation layer and the conductive redistribution layer, exposing a portion of the conductive redistribution layer;

forming an under-bump-metallurgy (UBM) layer over the portion of the portion of the conductive redistribution layer exposed by the planarization layer; and forming a conductive bump formed over the UBM layer.

15. The method as claimed in claim 14, wherein formation of the passivation layer over the semiconductor structure and the first bonding pad comprises:

conformably forming the passivation layer over the semiconductor structure and the first bonding pad;

performing a planarization process and removing a portion of the passivation layer over the first bonding pad, thereby leveling a top surface of the passivation layer over the semiconductor structure and the first bonding pad; and after the planarization process, forming a plurality of first openings in the passivation layer and exposing the plurality of portions of the first bonding pad.

16. The method as claimed in claim 14, wherein formation of the planarization layer over the passivation layer and the conductive redistribution layer to expose a portion of the conductive redistribution layer comprises:

forming the planarization layer formed over the passivation layer and the conductive redistribution layer; and forming an opening in a portion of the planarization layer and exposing the portion of the conductive redistribution layer.

17. The method as claimed in claim 14, wherein the passivation layer formed over the semiconductor structure and the first bonding pad has a flat top surface.

18. The method as claimed in claim 14, wherein the conductive redistribution layer formed over the portions of the first bonding pad exposed by the passivation layer has a substantially flat top surface.

19. The method as claimed in claim 14, wherein the portions of the first bonding pad exposed by the passivation layer respectively have a dimension of about 2 µm or above from a top view.

20. The method as claimed in claim 14, wherein the portions of the first bonding pad exposed by the passivation layer respectively have a circular, stripe-like, or polygonal shape.

21. The method as claimed in claim 14, further comprising a second bonding pad provided over another portion of the semiconductor structure.

22. The method as claimed in claim 21, wherein the passivation layer is also formed over the second bonding pad and exposes a plurality of portions of the second bonding pad.

23. The method as claimed in claim 22, wherein the conductive redistribution layer is formed over the portions of the second bonding pad exposed by the passivation layer, having a substantially flat top surface.

24. The method as claimed in claim 22, wherein the UBM layer is formed over a portion of the conductive redistribution layer formed over the portions of the first bonding pad exposed by the passivation layer or the portions of the second bonding pad exposed by the passivation layer.

25. The method as claimed in claim 14, wherein the passivation comprises dielectric materials, and the planarization layer comprises polyimide, polybenzoxazole or benzocyclobutene.

* * * * *